(12) United States Patent
Gomei et al.

(10) Patent No.: US 7,724,348 B2
(45) Date of Patent: May 25, 2010

(54) EXPOSURE APPARATUS AND METHOD, AND DEVICE MANUFACTURING METHOD

(75) Inventors: Yoshio Gomei, Utsunomiya (JP); Hiromitsu Takase, Utsunomiya (JP); Shigeru Terashima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 574 days.

(21) Appl. No.: 11/614,416

(22) Filed: Dec. 21, 2006

(65) Prior Publication Data

US 2007/0097342 A1    May 3, 2007

Related U.S. Application Data

(63) Continuation of application No. PCT/JP2006/317208, filed on Aug. 31, 2006.

(30) Foreign Application Priority Data

Sep. 2, 2005  (JP) ............................. 2005-255090

(51) Int. Cl.
  *G03B 27/52*   (2006.01)
  *G03B 27/42*   (2006.01)
(52) U.S. Cl. .......................................... 355/30; 355/53
(58) Field of Classification Search ................... 355/30, 355/53, 67; 250/492.2, 559.4
See application file for complete search history.

(56) References Cited

U.S. PATENT DOCUMENTS

| | | | |
|---|---|---|---|
| 4,618,990 A | 10/1986 | Sieb, Jr. et al. ................ 382/43 |
| 5,012,096 A | 4/1991 | Takeda et al. ............. 250/327.2 |
| 5,220,624 A | 6/1993 | Sakamoto et al. ............. 382/54 |
| 5,467,404 A | 11/1995 | Vuylsteke et al. ........... 382/274 |
| 6,009,208 A | 12/1999 | Mitra et al. ................. 382/254 |
| 6,072,913 A | 6/2000 | Yamada ...................... 382/275 |
| 6,721,031 B2 | 4/2004 | Hasegawa et al. ............. 355/30 |
| 6,721,032 B2 | 4/2004 | Hasegawa et al. ............. 355/30 |
| 6,721,390 B2 | 4/2004 | Matsuo et al. |
| 6,724,460 B2 | 4/2004 | Van Schaik et al. ........... 355/30 |

(Continued)

FOREIGN PATENT DOCUMENTS

EP    1 413 830 A2    6/2004

(Continued)

OTHER PUBLICATIONS

International Search Report dated Dec. 5, 2006, issued in corresponding International patent application No. PCT/JP2006/317208, forwarded in a Communication dated Dec. 12, 2006.

(Continued)

*Primary Examiner*—Peter B Kim
(74) *Attorney, Agent, or Firm*—Fitzpatrick, Cella, Harper & Scinto (57) ABSTRACT

An exposure apparatus for exposing a substrate to exposure light via an original. The apparatus includes a reflector, which includes a multilayer film and a ruthenium film, and reflects the exposure light. The multilayer film reflects the exposure light, and the ruthenium film is arranged on the multilayer film. A vacuum container contains the reflector, an exhauster exhausts exhaust gas in the vacuum container, and a regulator supplies water vapor into the vacuum container and regulates an amount of the water vapor in the vacuum container, based on an amount of carbonaceous gas in the vacuum chamber, so as to retard oxidation of the ruthenium film.

18 Claims, 6 Drawing Sheets

U.S. PATENT DOCUMENTS

| | | | |
|---|---|---|---|
| 6,813,335 B2 | 11/2004 | Shinbata | 378/62 |
| 6,934,003 B2 | 8/2005 | Hasegawa et al. | 355/30 |
| 6,954,255 B2 | 10/2005 | Hasegawa et al. | 355/30 |
| 7,050,648 B1 | 5/2006 | Shinbata | 382/274 |
| 7,095,479 B2 | 8/2006 | Stevens et al. | 355/30 |
| 7,123,343 B2 | 10/2006 | Hasegawa et al. | 355/30 |
| 7,172,788 B2 | 2/2007 | Yakshin et al. | 427/162 |
| 2002/0053353 A1 | 5/2002 | Kawata et al. | |
| 2003/0016780 A1 | 1/2003 | Matsuo et al. | 378/34 |
| 2003/0095240 A1 | 5/2003 | Van Schaik et al. | 355/30 |
| 2004/0253426 A1 | 12/2004 | Yakshin et al. | 428/212 |
| 2005/0057734 A1 | 3/2005 | Johannes Stevens et al. | 355/30 |
| 2005/0236585 A1* | 10/2005 | Miyake | 250/492.2 |
| 2006/0274292 A1 | 12/2006 | Hasegawa et al. | 355/30 |
| 2007/0030466 A1 | 2/2007 | Shuichi | 355/30 |
| 2007/0097342 A1 | 5/2007 | Gomei et al. | 355/53 |

FOREIGN PATENT DOCUMENTS

| | | |
|---|---|---|
| JP | 2002-237443 | 8/2002 |
| JP | 2003-31483 | 1/2003 |
| JP | 2003-188096 | 7/2003 |
| JP | 3467485 | 8/2003 |
| JP | 2004-207730 | 7/2004 |
| JP | 2006-49758 | 2/2006 |
| JP | 2006-319245 | 11/2006 |
| WO | WO 03/032329 | 4/2003 |

OTHER PUBLICATIONS

Graham, Samuel, et al. "RF Oxygen Discharge Cleaning of Carbon from EUV Optics," Second International EUVL Workshop, online, Oct. 19-20, 2000, International SEMATECH Manufacturing Iniative. http://www.sematech.org/resources/litho/meetings/euvI/20001019/index.htm, pp. 1-6.

Anan, Mitsuhiro, et al. "Proceedings of the 45$^{th}$ Annual Meeting, "Japanese Journal of Radiological Technology, vol. 45, No. 8, Aug. 1989. p. 1030.

Bajt, Saša, et al. "Emerging Lithographic Technologies VII: Design and performance of capping layers for EUV multilayer mirrors," Proceedings of SPIE, vol. 5037, Part One, Feb. 25-27, 2003, Santa Clara, CA. pp. 236-248.

M. Malinowski, et al., "Use of Molecular Oxygen to Reduce EUV-induced Carbon Contamination of Optics", Second International EUVL Workshop, online, Oct. 19-20, 2000, International SEMATECH Manufacturing Iniative. http://www.sematech.org/resources/litho/meetings/euvI/20001019/index.htm, pp. 1-7.

D. Dedrick, et al., "EUVL Thermophoretic Mask Protection", Second International EUVL Workshop, online, Oct. 19-20, 2000, International SEMATECH Manufacturing Iniative. http://www.sematech.org/resources/litho/meetings/euvI/20001019/index.htm, pp. 1-6.

Klebanoff, L. 2$^{nd}$ International EUVL Workshop, online, Oct. 19-20, 2000. International SEMATECH Manufacturing Initiative, searched Jun. 10, 2005, pp. 1-9. http://www.sematech.org/meetings/archives/litho/euvl/20001019/205_ENV05_klebanoff.pdf.

* cited by examiner

EXPOSURE APPARATUS AND METHOD, AND DEVICE MANUFACTURING METHOD

This application is a continuation of copending international patent application number PCT/JP2006/317208.

TECHNICAL FIELD

The present invention relates to an exposure apparatus and a method that expose a substrate to exposure light via an original, and a device manufacturing method.

BACKGROUND ART

A reduction projection exposure apparatus using ultraviolet (UV) light is currently used in leading-edge lithography for manufacturing a fine semiconductor element of a memory or logic circuit. Along with an increase in the degree of integration of a semiconductor element, the element often has a line width of 50 nm or less, but lithography using UV light may not be able to provide a sufficient resolving power. To combat this situation, lithography using EUV (Extreme Ultraviolet) light, with a shorter wavelength of 11 to 15 nm, is under development.

Unlike UV lithography, EUV lithography cannot use a transmissive optical element using refraction, because EUV light exhibits high absorbance. EUV lithography thus uses a reflective optical element, the surface of which has a multilayer film in which two types of materials having different optical constants are alternately stacked. EUV light having a wavelength of 13.5 nm or in its vicinity is reflected by a reflective optical element having a glass-based substrate surface, which is polished into a precise shape, and in which molybdenum (Mo) and silicon (Si) are alternately stacked efficiently. An EUV exposure apparatus causes a reduction projection optical system including such a reflective optical element to form a mask pattern image on the wafer.

Since the ambient gas component also absorbs EUV light, the exposure apparatus maintains its interior in an appropriate vacuum state. Gas containing moisture and a carbonaceous substance remains in that vacuum atmosphere. The gas containing these substances mainly results from the parts or cables used in the exposure apparatus. The gas also contains a component which vaporizes from the resist (photosensitive material) applied on the wafer. The surface of the optical element adsorbs these residual gas components. Throughout the duration of stay on that surface, EUV light strikes the residual gas components. Since EUV light also has a high substance decomposition ability, it decomposes the carbonaceous residual gas component on the surface into carbon, which deposits on that surface. Similarly, the EUV light decomposes the moisture on the surface into active oxygen, which oxidizes the surface material. The presence of carbon and oxygen on the surface allows it to absorb the EUV light in amounts which depend on their thicknesses. The absorption amount is non-negligible, and the reflectance of the optical element to EUV light deteriorates. A reduction projection optical system having an excellent resolving power requires a large number of optical elements. Therefore, deterioration in reflectance per element synergistically decreases the amount of light which passes through the optical system. This prolongs the exposure time, resulting in degradation in performance of the exposure apparatus.

There have been proposals for preventing carbon deposition and removing the carbon deposits up to now. To prevent carbon deposition, it is a common practice to decrease the pressure of the target gas in the atmosphere in which the optical element is placed. The target gas is, e.g., a hydrocarbon, such as methane, ethane, or propane, a straight-chain organic substance, such as isopropyl alcohol or polymethyl methacrylate, or a cyclic organic substance such as phthalate ester (Japanese Patent No. 3467485).

There is a proposal for removing deposited carbon in the following method (Japanese Patent Laid-Open No. 2003-188096). This method irradiates the deposited carbon with UV light or EUV light having a wavelength shorter than 250 nm in an environment in which an oxygen-containing species selected from water, nitrogen oxides, and oxygen-containing hydrocarbons exists in the atmosphere in which the optical element is placed. There is also a proposal for removing the carbon in the following method (Japanese Patent Laid-Open No. 2002-237443). This method introduces a processing gas containing at least one of the substances selected from the group consisting of a gas of water, oxygen, ozone, and a radical element, and irradiates the carbon with an electron beam.

A popular approach effective in preventing oxidation to some extent is to perform exposure after introducing ethanol in the atmosphere in which an optical element having a multilayer film, the uppermost layer of which is Si, is placed (L. Klebanoff, $2^{nd}$ International EUVL Workshop, [online], Oct. 19-20, 2000, International SEMATECH Manufacturing Initiative, [searched Jun. 10, 2005, Internet http://www.sematech.org/resources/litho/meetings/euvl/20001019/index/htm>). Also, a popular approach, which can suppress EUV light absorption to some extent, is to form a ruthenium (Ru) protective film on the uppermost layer of the multilayer film, because Ru has an anti-oxidative property (S. Bajt, H. Chapman, N. Nguyen, J. Alameda, J. Robinson, M. Malinowski, E. Gullikson, A. Aquila, C. Tarrio, S. Granthan, SPIE, 2003, Vol. 5037, p. 236).

DISCLOSURE OF INVENTION

Problems that the Invention is to Solve

Ru film, which is thought to be the most promising protective film as a multilayer film, at present, deteriorates in reflectance of EUV light, when an EUV light irradiation experiment in an environment, in which the carbonaceous residual gas component exists in small quantities and the exposure apparatus introduces moisture to simulate its environment, promotes oxidation of the Ru film. It is common knowledge that degradation in exposure capability resulting from the deterioration in reflectance is unallowable for an exposure apparatus, in practical use.

The present invention has been made in consideration of the above subject, and has as its object to provide a novel technique for reducing at least the former of the oxidation of a ruthenium (Ru) film and the deposition of carbon onto the ruthenium film.

Means of Solving the Problems

According to the first invention, an exposure apparatus is provided which exposes a substrate to exposure light via an original, the exposure apparatus comprising:

reflecting means which includes a multilayer film and a ruthenium film and reflects the exposure light, the multilayer film reflecting the exposure light, and the ruthenium film being arranged on the multilayer film;

a vacuum container which contains the reflecting means;

exhaust means which exhausts gas in the vacuum container; and regulating means which supplies water into the vacuum container and regulates an amount of water in the vacuum container.

According to the second invention, an exposure method of exposing a substrate to exposure light via an original, comprises:

an exhaust step of exhausting gas in a vacuum container which contains reflecting means that includes a multilayer film and a ruthenium film and reflects the exposure light, the multilayer film reflecting the exposure light, and the ruthenium film being arranged on the multilayer film; and a regulating step of supplying water into the vacuum container and regulating an amount of water in the vacuum container.

According to the third invention, a device manufacturing method comprises a step of exposing a substrate to exposure light using an exposure apparatus, according to the first invention, to expose a substrate.

According to the fourth invention, an exposure apparatus exposes a substrate to exposure light via an original, and comprises:

reflecting means which includes a multilayer film and a ruthenium film and reflects the exposure light, the multilayer film reflecting the exposure light, and the ruthenium film being arranged on the multilayer film;

a vacuum container which contains the reflecting means;

exhaust means which exhausts gas in the vacuum container;

detection means which detects an amount of a gas component in the vacuum container;

supply means which supplies at least one of a gas of water and a carbonaceous gas into the vacuum container; and control means which controls, based on an amount of a gas component detected by the detection means, an amount of the at least one supplied by the supply means, so that an amount of a gas of water and an amount of a carbonaceous gas satisfy a predetermined relationship.

According to the fifth invention, an exposure method of exposing a substrate to exposure light via an original, comprises:

an exhaust step of exhausting gas in a vacuum container which contains reflecting means that includes a multilayer film and a ruthenium film and reflects the exposure light, the multilayer film reflecting the exposure light, and the ruthenium film being arranged on the multilayer film; and a supply step of supplying at least one of a gas of water and a carbonaceous gas into the vacuum container, wherein the supply step regulates a supply amount of the at least one based on an amount of a gas component detected in the detection step, so that an amount of a gas of water and an amount of a carbonaceous gas satisfy a predetermined relationship.

According to the sixth invention, a device manufacturing method comprises a step of exposing a substrate to exposure light using an exposure apparatus, according to the fourth invention, to expose a substrate.

Other objects, features, and effects of the present invention will become apparent from the following description, taken with reference to the accompanying drawings. Note that the same or similar reference numerals denote the same or similar constituent components throughout the plurality of drawings.

EFFECTS OF THE INVENTION

The present invention can provide a novel technique for reducing at least the oxidation of a ruthenium film, and possibly, the deposition of carbon onto the ruthenium film.

DESCRIPTION OF THE REFERENCE NUMERALS 1 exposure apparatus
2 vacuum container
10 laser light source
12 condenser lens
14 plasma spot
16 illumination optical system
18 mask stage
20 mask
22 projection optical system
24 wafer stage
26 wafer
28 exhaust means
30 gas introduction system
31' detector
33' water supply source
34 carbonaceous gas supply source
35 controller

BEST MODE FOR CARRYING OUT THE INVENTION

First Embodiment

Figure 1:
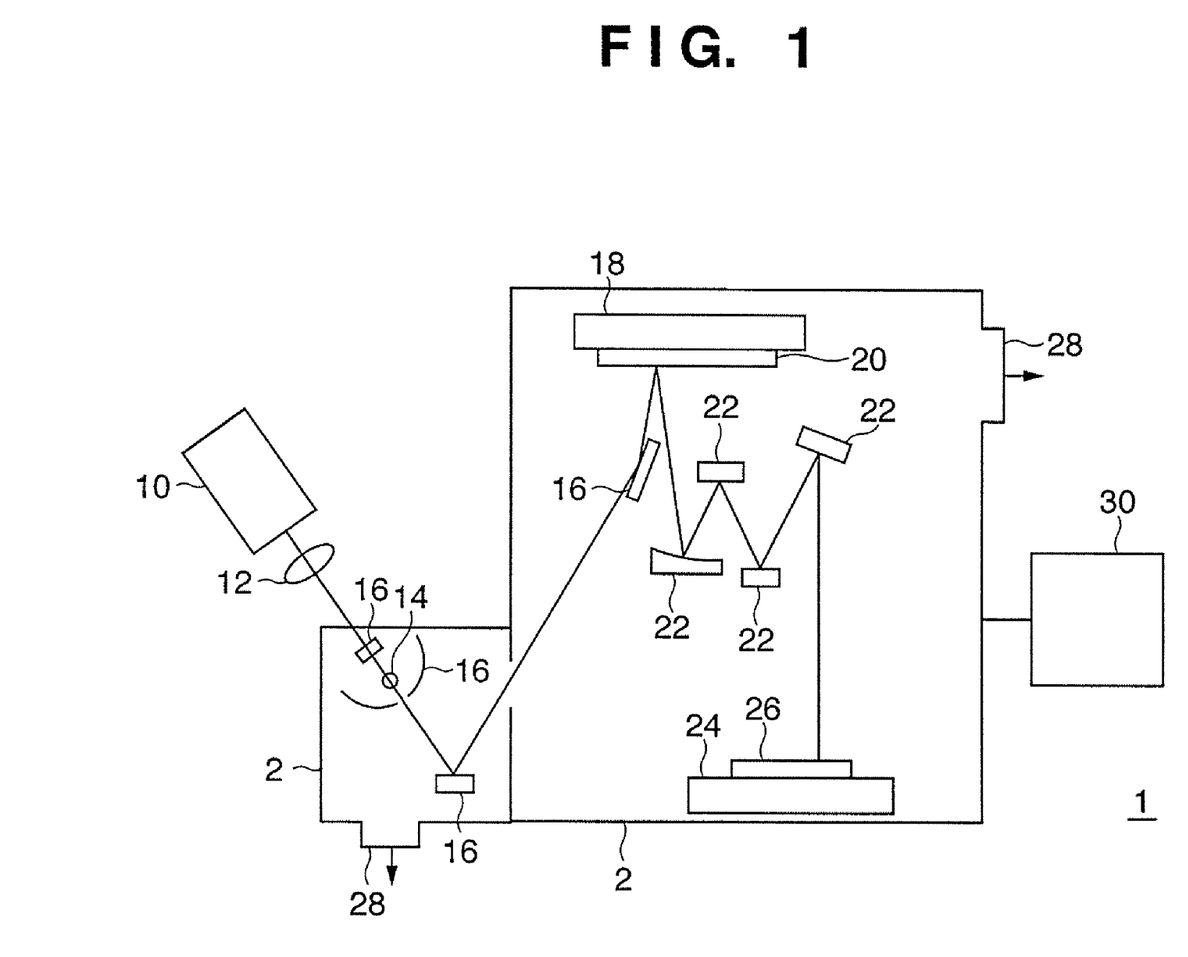
FIG. 1 is a view showing the structure of an exposure apparatus according to an embodiment of the present invention.

FIG. 1 shows an overview of an EUV exposure apparatus 1 according to an embodiment of the present invention. A plasma spot 14 formed at the condensing point of laser light from a laser light source 10 emits EUV light. An illumination optical system 16, including a large number of reflecting mirrors, condenses and shapes the EUV light so as to guide it to a reflecting mask 20. The mask has a predetermined pattern formed on it. The reflection pattern by the mask forms an image on a wafer 26 via a projection optical system 22. A mask stage 18 and wafer stage 24 can be translated and respectively support the mask and wafer on them. Exposing the wafer via the pattern of the mask while synchronously scanning the mask and wafer in one direction makes it possible to project onto the wafer a pattern with a large size along the scanning direction. Besides the laser plasma light source described above, the light source unit which generates EUV light may be, e.g., an electrical discharge plasma light source. The use of UV light requires the exposure apparatus 1 to positively use UV light emitted from an EUV light source or to introduce light from a UV light source en route to the illumination optical system. Since UV light disadvantageously inhibits imaging on the wafer, its excessive use is unallowable. A certain type of EUV light source emits light containing UV light. In order to set the amount of UV light equal to or lower than the allowable value by incorporating a filter in the illumination system, it is necessary to appropriately set the thickness of the filter.

To coat the optical element used for each of the mask 20, illumination optical system 16, and projection optical system 22 with a multilayer film, it is a common practice to obtain the film by depositing about fifty pairs of Si and Mo as described above. A vacuum container 2 accommodates the wafer 26, mask 20, illumination optical system 16, projection optical system 22, mask stage 18, and wafer stage 26. An exhaust means 28, such as a turbo molecular pump, temporarily exhausts gas in the vacuum container until it obtains a pressure of around 10-5 to 10-6 Pa. After that, a gas introduction system 30 introduces moisture into the vacuum container until it obtains a predetermined pressure. The exposure apparatus 1 executes exposure while maintaining that state. The characteristic feature of this embodiment is to continuously introduce moisture at a predetermined pressure into the atmosphere in which the optical element is placed, while the exposure apparatus is in operation. When a filter or a path with a very low conductance is to further segment the space in the vacuum container, it suffices to mount the exhaust system 28 and gas introduction system 30 to an appropriate place.

Figure 2:
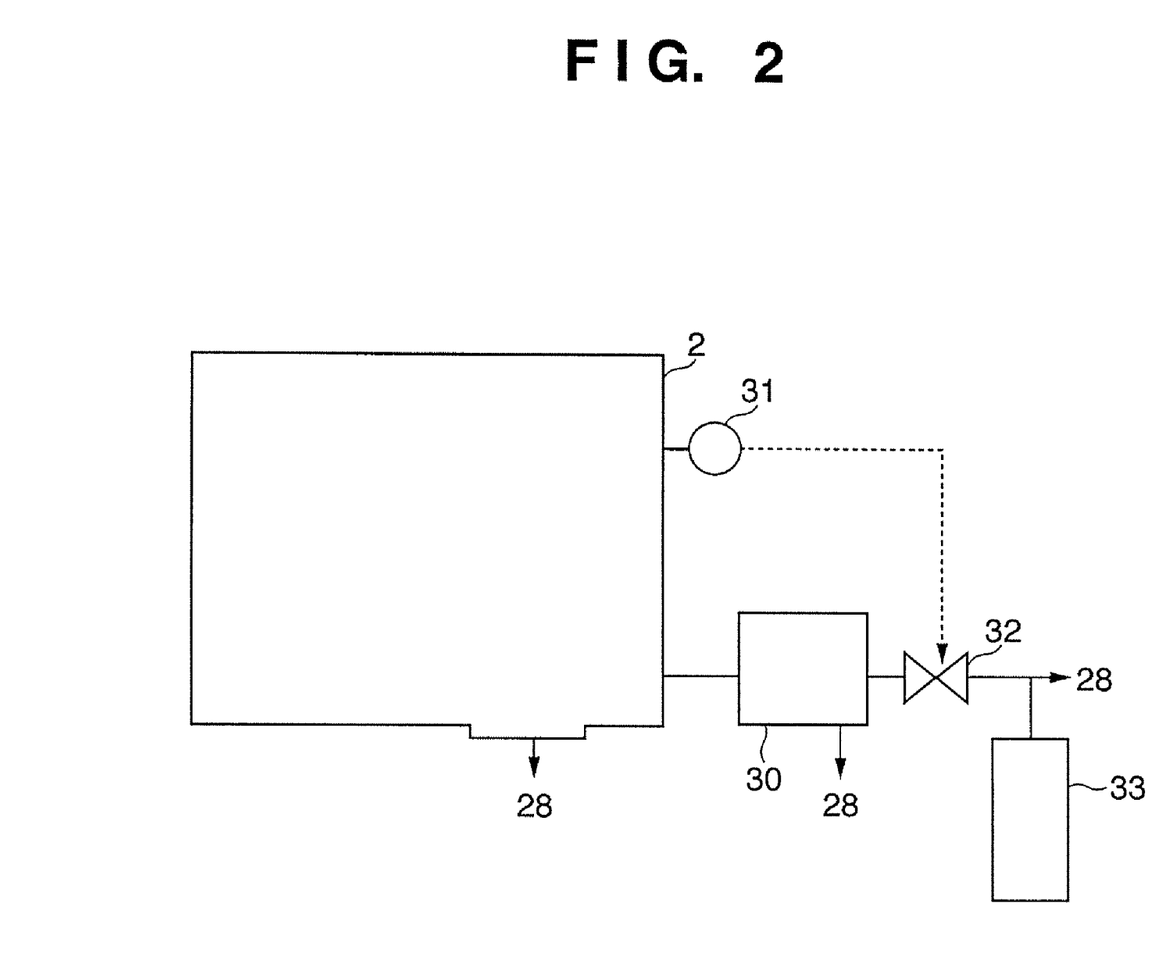
FIG. 2 is a view showing the structure of the main part of the exposure apparatus.

The gas introduction system 30 can supply a plurality of gases where necessary. FIG. 2 is a schematic view for explaining an example of the structure of the gas introduction system 30 and a moisture supply system (water supply system), both of which serve as regulating means, which regulates the content of the water (gas) in the vacuum container 2. The gas introduction system 30 includes a tank, which connects to the exhaust means 28 here. Referring to FIG. 2, a pressure sensor 31 measures the pressure (the partial pressure of water) in the vacuum container 2. A flow regulating mechanism 32 includes a regulating valve, the degree of opening of which changes in accordance with the output from the pressure sensor 31. A container 33 holds ultra-pure water. The pressure sensor 31, flow regulating mechanism 32, and container 33 form a water supply system. The container 33 has the function of freezing water. The container 33 temporarily freezes its internal ultra-pure water. In this state, the regulating valve closes and the exhaust means 28 sufficiently exhausts gas in the water supply system. The frozen water is then restored to a liquid phase. The water supply system supplies the vapor of the liquid-phase water to the gas introduction system 30. The flow regulating mechanism 32 regulates the flow rate of the water supplied to the gas introduction system 30 in accordance with the signal from the pressure sensor 31. To coarsely regulate the pressure, the outlet of the container 33 may have a regulating valve, the degree of opening of which is constant. Controlling the exhaust speed of the exhaust means 28 attached to the gas introduction system 30 is sometimes effective in finely regulating the amount of the gas supplied to the vacuum container 2. This makes it possible to set the water pressure (partial pressure) in the vacuum container 2 of the exposure apparatus to a desired pressure. Furthermore, it is possible to connect or to independently add, to the gas introduction system 30, where necessary, a carbonaceous gas supply system having the same arrangement as that of, e.g., the water supply system. It suffices to adopt an appropriate supply method in accordance with the carbonaceous gas used. If the supply target substance is one that has a gas phase at room temperature and normal pressure, the supply system requires no freezing function.

The present invention has been conceived in the process of an acceleration test to be described below. The intensity of EUV light, which strikes the projection optical system 22 of the exposure apparatus largely varies within the range of 0.2 to 20 mW/cm$^2$, depending on the optical element in question. The projection optical system of the exposure apparatus desirably has a life of several years or equal to that of the exposure apparatus. An acceleration test, which used 10 W/cm$^2$ EUV light, around five hundred times the high-intensity irradiation with which a mirror is ordinarily irradiated, was conducted. This experiment measured the spectrum of the residual gases after evacuating, for several days, the vacuum container used. The measurement result revealed that the major component of the residual gases having a total pressure value of $7\times10^{-5}$ Pa was water having a mass number of eighteen. It is a common practice to define fifty-five as the mass number of a carbonaceous gas component, which influences the Ru surface upon EUV irradiation. The content of a carbonaceous gas component having a mass number of fifty-five was around $\frac{1}{10,000}$ that of water having a mass number of eighteen. The carbonaceous component resulted from the parts or cables used in the laboratory equipment. However, a carbonaceous component may exist in the vacuum container 2 of the exposure apparatus, as well, even though it might be different in amount from that of the laboratory equipment. To confirm this, EUV light was introduced into the above-described atmosphere, so as to irradiate an Mo and Si multilayer film substrate (optical element sample) having an uppermost layer of 2 nm Ru added.

Figure 3:
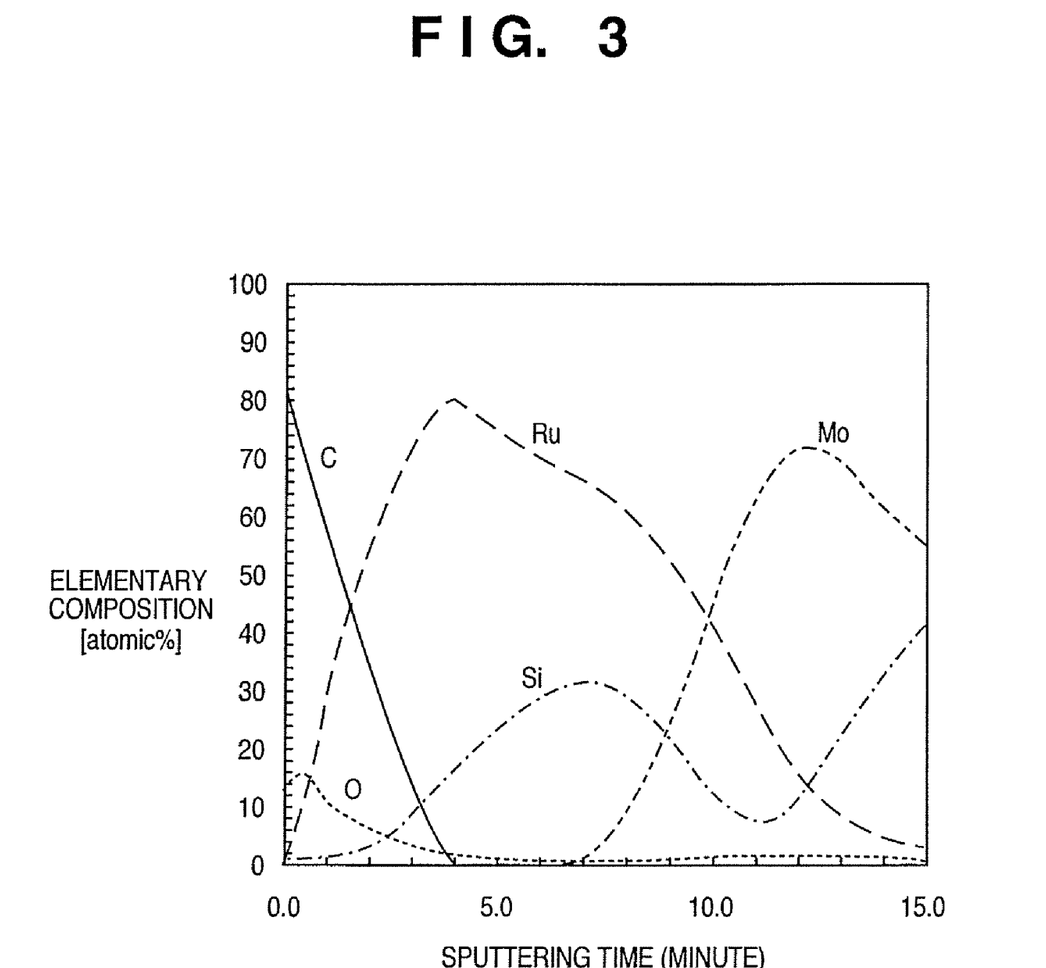
FIG. 3 is a graph showing an elementary composition found by an Auger/sputtering technique.
Figure 4:
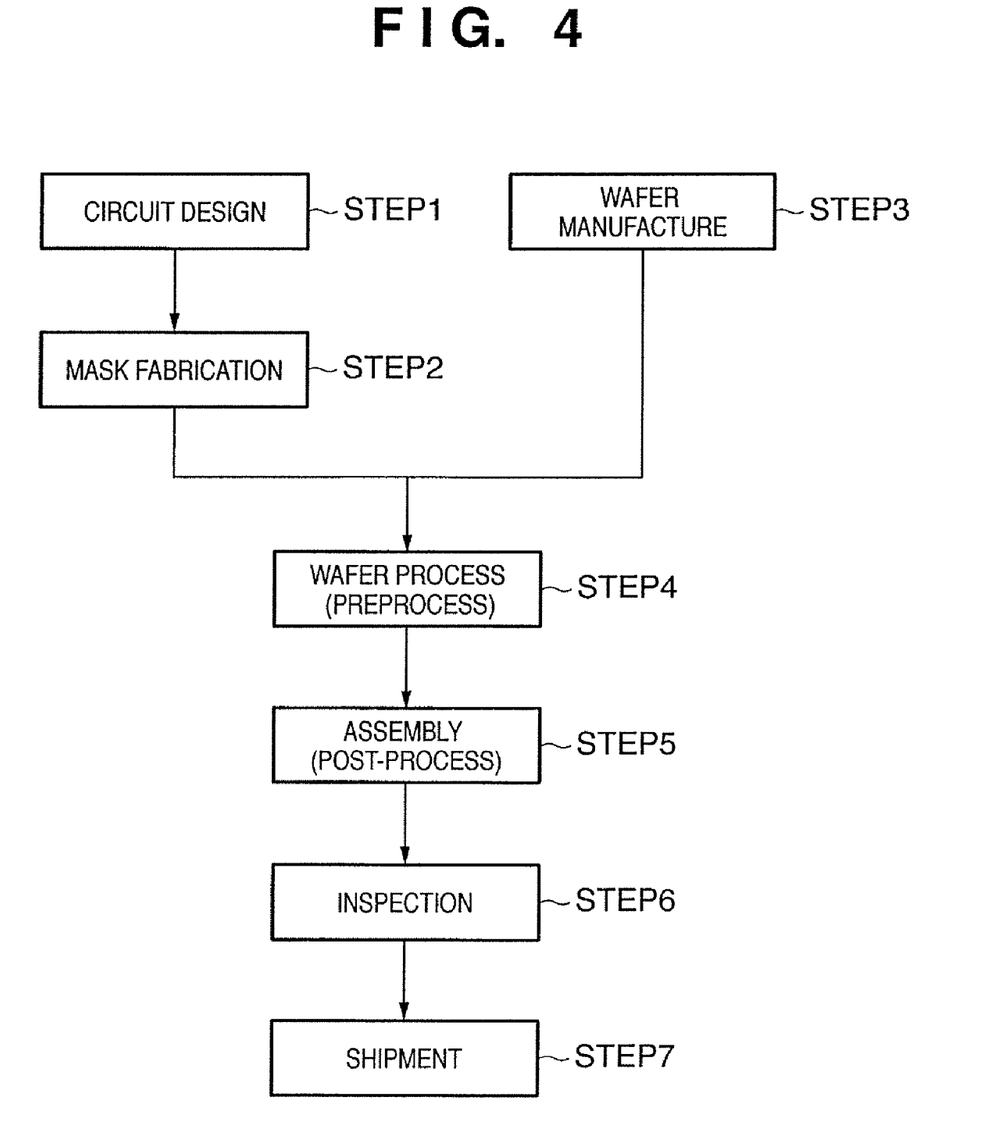
FIG. 4 is a flowchart showing the procedure for manufacturing a semiconductor device.

The experimental result revealed that the irradiation center maintained 99% of the initial reflectance, even though it received $2.3\times10^5$ J/cm$^2$ light. The amount of $2.3\times10^5$ J/cm$^2$ corresponds to irradiation of $1.2\times10^7$ sec (about 3,300 hours), even when an optical element is assumed to be illuminated with 20 mW/cm$^2$. To check the reason why the irradiation center maintained its reflectance in this manner, a method using an Auger electron spectroscope and ion sputtering was used to test the elementary composition of the irradiation position along its depth direction. FIG. 3 shows the test result. The abscissa represents the ion sputtering time, and the ordinate represents the elementary composition. The result indicated that a thin carbon layer was formed and held on the Ru surface, so that it suppressed oxidation of the Ru surface to a very low level. The result shown in FIG. 3 is at an EUV light irradiation position where the carbon layer was most clearly observable. Some places, each having a high EUV light illuminance, were less likely to form carbon layers. However, the result indicated that, even in these places, carbon layers generated over time by EUV light irradiation effectively protected the Ru against oxidation. An oxidizing component due to the presence of the water generated by EUV light irradiation oxidizes and changes that carbon layer into a vapor (gas). The vapor desorbs from the surface. This process suppresses oxidation of the Ru.

It is fundamental knowledge that an acceleration test requires an increase, not only in illuminance, but also, in the pressure of the moisture. For this purpose, this test introduced moisture next until the total pressure became $1\times10^{-2}$ Pa to execute an irradiation experiment. This experiment was continued until the irradiation amount became 700 J/cm$^2$. The reflectance of the irradiation center maintained 99% of the initial value, as was expected. Detailed evaluation revealed that a carbonaceous gas having a mass number of fifty-five was introduced in proportion to the amount of water introduced. The fact that the irradiation center maintained the reflectance of the EUV light, even under that influence, indicates that the present invention is widely effective. The material characteristic of Ru supports the probability that a thin carbon protective film forms on the Ru surface depending on the quantity relationship between the carbonaceous component and the moisture which exists in the atmosphere in which the optical element is placed. That is, deposition of a thin carbon film on the Ru surface allows the protection of the Ru against oxidation, while minimizing a decrease in the reflectance.

This makes it effective to positively control the moisture content in the atmosphere in which the optical element is placed. An appropriate moisture content depends on the content of the carbonaceous residual gas component, which exists in the atmosphere. The appropriate moisture content also depends on the intensity of EUV light irradiated. Positively introducing a carbonaceous gas component is also effective in producing an optimal state. Simultaneously irradiating EUV light and vacuum ultraviolet light is also effective in forming a protective film.

The experiments up to now showed that a thick carbon layer deposits on a region where the intensity of EUV light is very small, and the reflectance to the EUV light decreases as the deposition progresses. Therefore, it is desirable to select an appropriate method after answering the following questions.

(i) Is it possible to produce a desirable effect only by controlling the introduced moisture content in accordance with the atmosphere and irradiation conditions in the exposure apparatus?

(ii) Is it necessary to introduce both moisture and an appropriate carbonaceous gas?

(iii) Is it necessary to further irradiate with vacuum ultraviolet light?

For example, it is desirable to enable the setting of the exposure apparatus so as to produce a desired effect by decreasing, to a practically attainable range, the amount of carbonaceous gas, which is expressed by the mass number fifty-five and exists in the atmosphere in which the optical element of the exposure apparatus is placed, and introducing appropriate moisture. It is possible to introduce desired moisture free from any excessive mixture of a carbonaceous gas expressed by the mass number fifty-five by considering the structure of the water supply system. For example, it is effective to use ultra-pure water in the water supply system and sufficiently exhaust gas in the water supply system while the water is frozen.

The water pressure in the vacuum container regulated by the regulating means, including the water supply system and gas introduction system, is preferably $1\times10^{-6}$ Pa (inclusive) to $1\times10^{-2}$ Pa (inclusive). The amount of $1\times10^{-6}$ Pa is the lower limit value at which pressure regulating is practically executable. When the pressure value is less than that lower limit value, no effect of suppressing deposition of a carbon layer is expected. When the pressure value exceeds $1\times10^{-2}$ Pa as the upper limit, adverse effects such as attenuation of the EUV light and oxidation of the surface of the optical element occur.

When the regulating means regulates the pressure of the carbonaceous gas in the vacuum container, a gas to be supplied into the vacuum container is desirably at least one of either hydrocarbon or alcohol. At this time, the regulating means desirably regulates the gas in the vacuum container to $1\times10^{-10}$ Pa (inclusive) to $1\times10^{-6}$ Pa (inclusive). The amount of $1\times10^{-10}$ Pa is the lower limit value at which pressure regulating is practically executable. When the pressure value is less than that lower limit value, no effect of generating a carbon layer, which suppresses oxidation of the surface of the optical element, is expected. When the pressure value exceeds $1\times10^{-6}$ Pa as the upper limit, adverse effects, such as a decrease in reflectance of the optical element due to excessive deposition of the carbon layer, occur.

Figure 5:
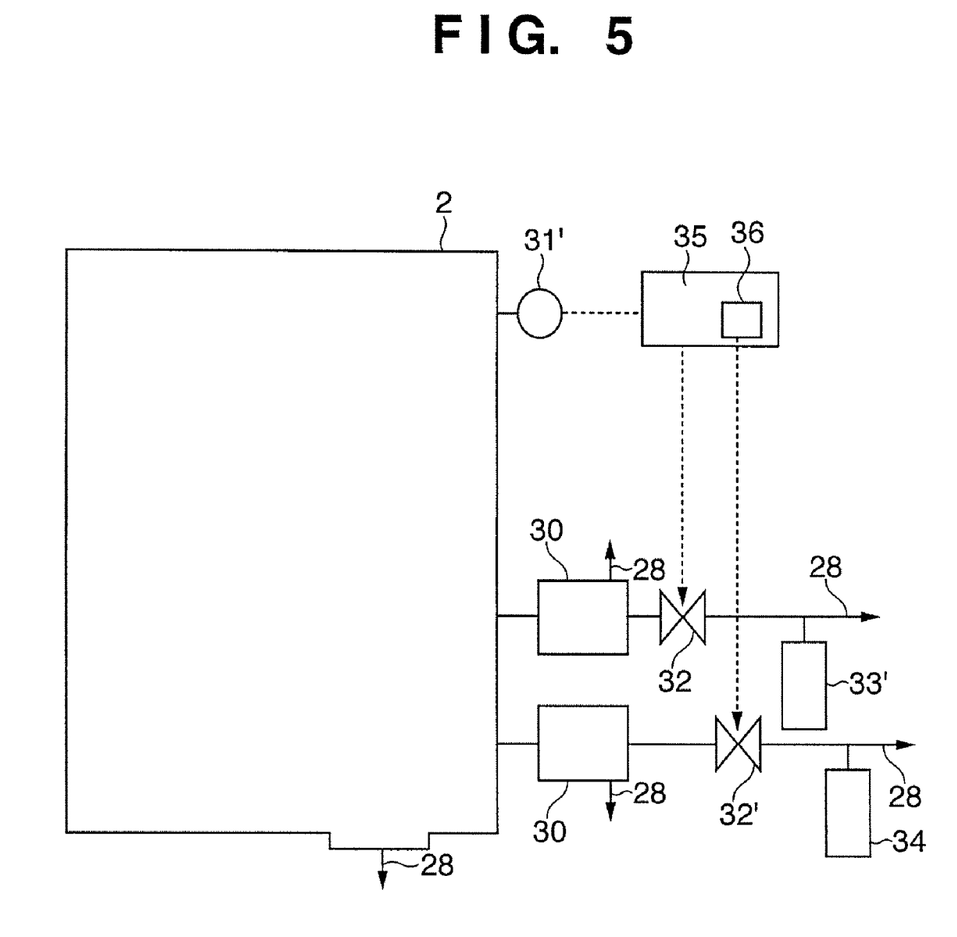
FIG. 5 is a view showing the structure of the main part of an exposure apparatus according to another embodiment of the present invention.

Another embodiment according to the present invention will be explained next. FIG. 5 is a view showing the structure of the main part of an EUV exposure apparatus according to this embodiment. The overall structure of the EUV exposure apparatus is the same as that shown in FIG. 1. The same or similar reference numerals as in FIG. 2 denote the same or similar constituent components in FIG. 5, and a description thereof will be arbitrarily omitted.

A vacuum container 2 of the EUV exposure apparatus incorporates not only a projection optical system, but also, a mask stage and wafer stage. For this reason, the residual gas component in the atmosphere of the vacuum container 2 will not become clear until the design and manufacture of the exposure apparatus is complete. Also, the residual gas component changes over time, depending on the use status, or the like. Therefore, the exposure apparatus includes a detector 31' to detect the content of the residual gas component in the vacuum container 2. The detector 31' may be, e.g., a quadrupole mass spectrometer. In this embodiment, the exposure apparatus further includes a carbonaceous gas supply source 34 to supply a carbonaceous gas into the vacuum container 2, in addition to a water supply source 33 to supply water (gas) into the vacuum container 2. The carbonaceous gas can be selected from, e.g., a group of compounds specified as hydrocarbons or alcohols.

A controller 35 can regulate the water supply amount by controlling the degree of opening of a valve 32 on the basis of the content of the gas component detected by the detector 31'. The controller 35 can also regulate the supply amount of the carbonacous gas by controlling the degree of opening of a valve 32' on the basis of the content of the gas component detected by the detector 31'. A storage device (memory) 36 stores information for determining the supply amount of at least one of water and carbonaceous gas, e.g., information about the relationship between the water amount and the carbonaceous gas amount. The memory 36 preferably stores the relationship information under each of a plurality of exposure conditions. The exposure conditions include, e.g., the exposure light (EUV light) irradiation condition or exposure light energy.

The relationship information can take, e.g., a table format, which shows the correspondence between the water amount and the carbonaceous gas amount, that is prepared for each exposure condition.

Figure 6:
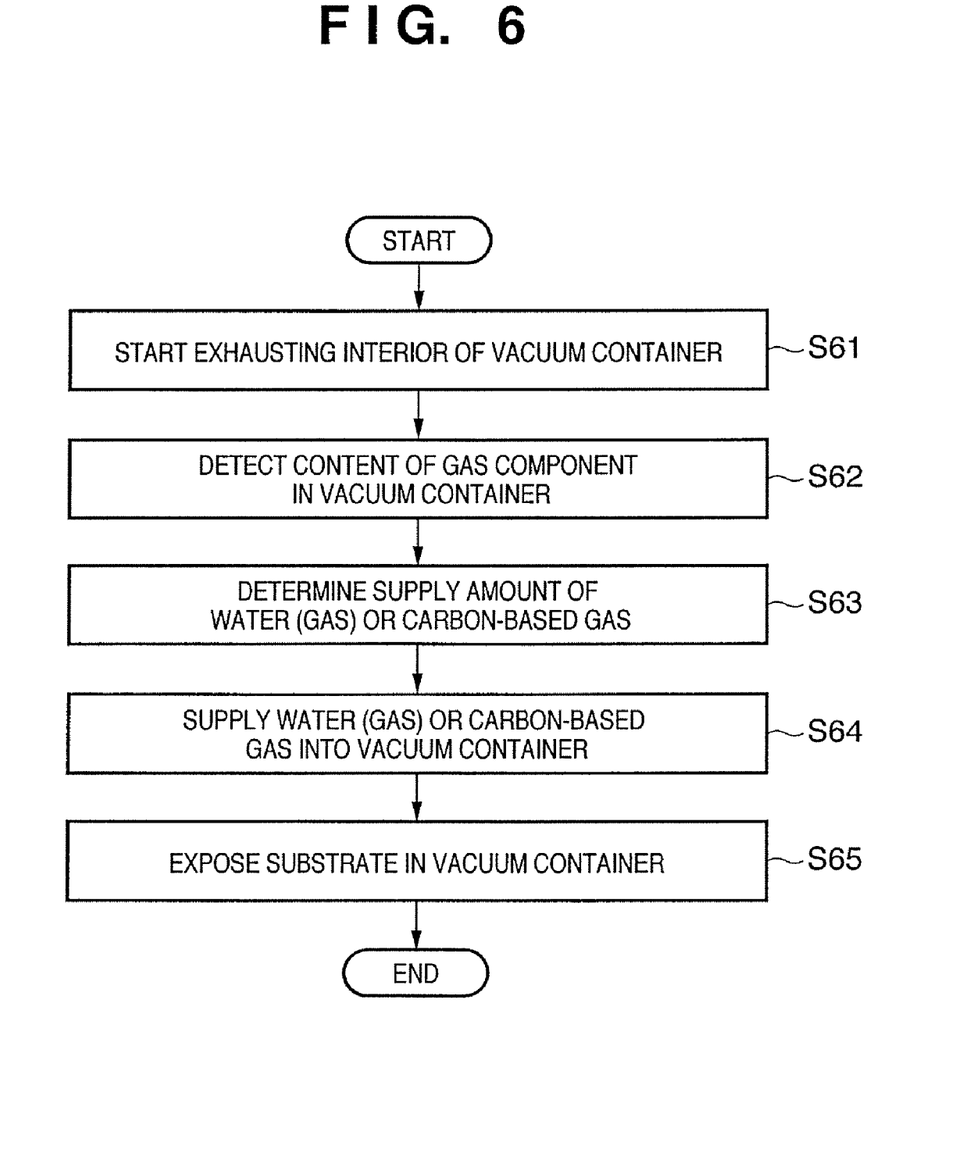
FIG. 6 is a flowchart showing the operation of the exposure apparatus.

The operation of the EUV exposure apparatus according to this embodiment will be explained below with reference to FIG. 6. FIG. 6 is a flowchart showing the procedure of that operation. In step S61, the exhaust means 28 starts exhausting gas in the vacuum container 2 of the EUV exposure apparatus. After the degree of vacuum of the vacuum container 2 has reached a predetermined one suitable for exposure, the detector 31' detects the content (partial pressure) of the residual gas component in the vacuum container 2 in step S62.

For example, it is possible to determine the relative quantity of the carbonaceous residual gas component to the water, on the basis of the contents of a gas component having a mass number of eighteen (water) and a gas component having a mass number of forty-five or more. In practice, the amount of a gas having a mass number of fifty-five often enables determination. As one example, it is possible to determine that the carbonaceous residual gas component exists in large quantities, when its content exceeds $1/10{,}000$ that of the water (mass number: eighteen), and to determine that the carbonaceous residual gas component exists in small quantities when its content is equal to or less than $1/10{,}000$ that of the water. However, this determination criterion depends on the type of existing gas, and may also be a numerical value different from 1/10,000 of the water content.

As described above, it is preferable to calculate in advance an appropriate quantity relationship between the water and the carbonaceous gas for each exposure condition by actually measuring the element distribution of the Ru film surface exposed with the EUV light in the vacuum container 2. The appropriate quantity relationship indicates one which provides the ability to suppress the oxidation of the Ru film and to suppress the deposition of carbon onto the Ru film. The above-described storage device stores the calculated quantitative relationship. The controller 35 uses the stored quantity relationship to determine the supply amount of at least one of water and a carbonaceous gas.

If the carbonaceous residual gas component exists in large quantities, the controller 35 opens the valve 32 of the water supply means comprising the water supply source 33, to supply water into the vacuum container 2. At this time, the controller 35 automatically controls the degree of opening of the valve 32, so as to obtain a proper partial pressure of the water, to retard the progress of oxidation of the Ru film. On the other hand, if the hydrocarbon-based residual gas component exists in small quantities, the controller 35 opens the valve 32' of the carbonaceous gas supply means comprising the carbonaceous gas supply source 34, to supply a carbonaceous gas (for example, at least one of a hydrocarbon and an alcohol) into the vacuum container 2. At this time, the controller 35 automatically controls the degree of opening of the valve 32', so as to obtain a proper partial pressure of the carbonaceous gas, to prevent carbon from excessively depositing on the Ru film.

When the supply amount or exhaust amount of the carbonaceous gas decreases or increases, so that the partial pressure of the carbonaceous gas decreases to the requested value, the partial pressure of the water sometimes decreases at the same time. Additionally, appropriate amounts of water and carbonaceous gas may optimally exert an effect of reducing oxidation and/or carbon deposition. In such cases, it is effective to introduce both water and a carbonaceous gas into the vacuum container 2, so as to appropriately control their partial pressures.

In this manner, in step S63, the controller 35 determines the supply amount of at least one of water (gas) and a carbonaceous gas, on the basis of the content (partial pressure) of the residual gas component in the vacuum container 2 detected using the detector 31'. The determination refers to the above-described information about an appropriate quantity relationship between the water and the carbonaceous gas for each exposure condition, which is calculated in advance and stored in the storage device 36.

Subsequently, in step S64, the controller controls the degree of opening of at least one of the valves 32 and 32', on the basis of the determined supply amount of at least one of water and a carbonaceous gas. This provides the ability to supply at least one of water (gas) and a carbonaceous gas into the vacuum container 2. The controller regulates its supply amount by the degree of opening of at least one of the valves 32 and 32'.

The above-described method reduces the deposition of carbon onto the Ru film in the vacuum container 2, or reduces both the deposition of carbon onto the Ru film and the oxidation of the Ru film. The exposure apparatus exposes a wafer (substrate) 26 in the vacuum container 2 via reflecting means (mirror) 16 and 22 and reflecting mask 20, in step S65.

This embodiment has exemplified the case in which the exposure apparatus has both the water supply source 33 and carbonaceous gas supply source 34. However, it is conceivable that the content (partial pressure) of one of water (gas) and carbonaceous gas is always larger than that of the other one in the vacuum container 2, depending on the apparatus arrangement and/or apparatus use condition. In this case, the exposure apparatus may have a necessary one of the water supply source 33 and carbonaceous gas supply source 34.

A device manufacturing process using the above-described exposure apparatus will be explained next by taking a semiconductor device as an example. FIG. 6 is a flowchart showing the procedure for manufacturing a semiconductor device. In step 1 (circuit design), the circuit of a semiconductor device is designed. In step 2 (mask fabrication), a mask (also called an original or a reticle) is fabricated, on the basis of the designed circuit pattern.

In step 3 (wafer manufacture), a wafer (also called a substrate) is manufactured using a material such as silicon. In step 4 (wafer process), called a preprocess, the above-described exposure apparatus forms an actual circuit on the wafer by lithography using the mask and wafer. In step 5 (assembly), called a post-process, a semiconductor chip is formed from the wafer manufactured in step 4. This step includes processes, such as assembly (dicing and bonding) and packaging (chip encapsulation). In step 6 (inspection), inspections, including an operation check test and a durability test of the semiconductor device manufactured in step 5, are performed. A semiconductor device is completed with these processes and shipped, in step 7.

The wafer process in step 4 includes the following steps an oxidation step of oxidizing the wafer surface, a CVD step of forming an insulating film on the wafer surface, an electrode formation step of forming an electrode on the wafer by vapor deposition, an ion implantation step of implanting ions in the wafer, a resist processing step of applying a photosensitive agent to the wafer, an exposure step of causing the above-described exposure apparatus to expose the wafer having undergone the resist processing step, a development step of developing the wafer exposed in the exposure step, an etching step of etching portions other than the resist image developed in the development step, and a resist removal step of removing any unnecessary resist remaining after etching. By repeating these steps, a multilayered structure of circuit patterns is formed on the wafer.

The invention claimed is:

1. An exposure apparatus for exposing a substrate to exposure light via an original, said apparatus comprising:
    a reflector which includes a multilayer film and a ruthenium film, and is configured to reflect the exposure light, said multilayer film reflecting the exposure light, and said ruthenium film being arranged on said multilayer film;
    a vacuum container configured to contain said reflector;
    an exhauster configured to exhaust gas in said vacuum container; and
    a regulator configured to supply water vapor into said vacuum container and configured to regulate an amount of the water vapor in said vacuum container, based on an amount of carbonaceous gas in said vacuum chamber, so as to retard oxidation of said ruthenium film.

2. An apparatus according to claim 1, wherein said regulator is further configured to supply at least one of hydrocarbon and alcohol into said vacuum container, and to regulate an amount of the at least one of the hydrocarbon and the alcohol in said vacuum container.

3. An apparatus according to claim 2, wherein said regulator is configured to regulate a pressure of the at least one of the hydrocarbon and the alcohol in said vacuum container to a value not less than $1\times10^{-10}$ Pa and not greater than $1\times10^{-6}$ Pa.

4. An apparatus according to claim 1, further comprising an irradiator configured to irradiate said reflector with vacuum ultraviolet light.

5. An apparatus according to claim 1, wherein said regulator is configured to regulate a pressure of the water vapor in said vacuum container to a value not less than $1\times10^{-6}$ Pa and not greater than $1\times10^{-2}$ Pa.

6. An apparatus according to claim 1, wherein the exposure light includes extreme ultraviolet light.

7. A method of manufacturing a device, said method comprising:
exposing a substrate to exposure light using an exposure apparatus as defined in claim 1;
developing the exposed substrate; and
processing the developed substrate to manufacture the device.

8. An exposure method of exposing a substrate to exposure light via an original, said method comprising:
exhausting gas in a vacuum container which contains a reflector that includes a multilayer film and a ruthenium film, and reflects the exposure light, the multilayer film reflecting the exposure light, and the ruthenium film being arranged on the multilayer film;
supplying water vapor into the vacuum container; and
regulating an amount of the water vapor in the vacuum container, based on an amount of carbonaceous gas in the vacuum container, so as to retard oxidation of the ruthenium film.

9. An exposure apparatus for exposing a substrate to exposure light via an original, said apparatus comprising:
a reflector including a multilayer film and a ruthenium film, and configured to reflect the exposure light, said multilayer film reflecting the exposure light, and said ruthenium film being arranged on said multilayer film;
a vacuum container configured to contain said reflector;
an exhauster configured to exhaust gas in said vacuum container;
a detector configured to detect an amount of water vapor and an amount of carbonaceous gas in said vacuum container;
a supplier being capable of supplying both water vapor and carbonaceous gas into said vacuum chamber and being capable of supplying only one of the water vapor and the carbonaceous gas into said vacuum container; and
a controller configured to control said supplier, based on the amount of the water vapor and the amount of carbonaceous gas detected by said detector, a ratio between an amount of the water vapor and an amount of the carbonaceous gas in said vacuum container being regulated to a predetermined ratio, so as to retard oxidation of said ruthenium film.

10. An apparatus according to claim 9, further comprising a storage configured to store information of the predetermined relationship.

11. An apparatus according to claim 10, wherein said storage is configured to store information of the predetermined relationship with respect to each of a plurality of exposure conditions.

12. An apparatus according to claim 11, wherein the exposure conditions include an irradiation condition of the exposure light.

13. An apparatus according to claim 11, wherein the exposure conditions include energy of the exposure light.

14. An apparatus according to claim 9, wherein the carbonaceous gas includes at least one of the hydrocarbon and alcohol.

15. An apparatus according to claim 9, further comprising an irradiator configured to irradiate said reflector with vacuum ultraviolet light.

16. An apparatus according to claim 9, wherein the exposure light is extreme ultraviolet light.

17. A method of manufacturing a device, said method comprising:
exposing a substrate to exposure light using an exposure apparatus as defined in claim 9;
developing the exposed substrate; and
processing the developed substrate to manufacture the device.

18. An exposure method of exposing a substrate to exposure light via an original, said method comprising:
an exhaust step of exhausting gas in a vacuum container, which contains a reflector that includes a multilayer film and a ruthenium film, and reflects the exposure light, the multilayer film reflecting the exposure light, and the ruthenium film being arranged on the multilayer film;
a detection step of detecting an amount of water vapor and an amount of carbonaceous gas in the vacuum container; and
a supply step of supplying at least one of water vapor and a carbonaceous gas in the vacuum container, by controlling a supplier configured to supply both water vapor and carbonaceous gas into the vacuum container and being capable of supplying only one of water vapor and carbonaceous gas into the vacuum container, based on the amount of the water vapor and the amount of the carbonaceous gas detected in said detection step, so that a ratio between the amount of water vapor and the amount of carbonaceous gas in the vacuum container is regulated to a predetermined ratio, so as to retard oxidation of the ruthenium film.

* * * * *